(12) United States Patent
Luan et al.

(10) Patent No.: US 8,013,438 B2
(45) Date of Patent: Sep. 6, 2011

(54) SEMICONDUCTOR PACKAGE WITH A STIFFENING MEMBER SUPPORTING A THERMAL HEAT SPREADER

(75) Inventors: Jing-En Luan, Singapore (SG); Kum-Weng Loo, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 132 days.

(21) Appl. No.: 12/507,049

(22) Filed: Jul. 21, 2009

(65) Prior Publication Data

US 2011/0018125 A1    Jan. 27, 2011

(51) Int. Cl.
*H01L 23/34* (2006.01)
(52) U.S. Cl. .................... 257/707; 257/E23.101
(58) Field of Classification Search .............. 257/706, 257/712, E23.101, E23.11, 675, 717, 707
See application file for complete search history.

(56) References Cited

U.S. PATENT DOCUMENTS

| | | | | |
|---|---|---|---|---|
| 5,705,850 A | * | 1/1998 | Ashiwake et al. | ........... 257/714 |
| 5,805,419 A | * | 9/1998 | Hundt et al. | ................ 361/719 |
| 5,896,651 A | | 4/1999 | Hawthorne | |
| 6,008,536 A | * | 12/1999 | Mertol | ......................... 257/704 |
| 6,011,304 A | * | 1/2000 | Mertol | ......................... 257/706 |
| 7,449,775 B1 | * | 11/2008 | Ankireddi | ................... 257/712 |
| 2003/0030968 A1 | | 2/2003 | Tsao et al. | |
| 2005/0173787 A1 | | 8/2005 | Zhao et al. | |
| 2005/0280139 A1 | | 12/2005 | Zhao et al. | |
| 2008/0198552 A1 | | 8/2008 | Cho et al. | |

OTHER PUBLICATIONS

EPO Search Report and Written Opinion for EP 10170318.9 mailed May 12, 2011 (5 pages).

* cited by examiner

*Primary Examiner* — Thomas L Dickey
*Assistant Examiner* — Nikolay Yushin
(74) *Attorney, Agent, or Firm* — Lisa K. Jorgenson; Andre M. Szuwalski

(57) ABSTRACT

A semiconductor package includes a substrate board and a semiconductor die attached to a top surface of that substrate board. A heat spreader is provided over the semiconductor die. A stiffening ring is positioned surrounding the semiconductor die, the stiffening ring being attached to the top surface of the substrate board and attached to a bottom surface of the plate portion of the heat spreader. Space is left on the board outside of the stiffening ring to support the installation of passive components to the substrate board. An external ring may be included, with that external ring being interconnected to the stiffening ring by a set of tie bars. Alternatively, the heat spreader includes an integrally formed peripheral sidewall portion.

26 Claims, 5 Drawing Sheets

SEMICONDUCTOR PACKAGE WITH A STIFFENING MEMBER SUPPORTING A THERMAL HEAT SPREADER

BACKGROUND OF THE INVENTION

1. Technical Field of the Invention

The present invention relates generally to semiconductor packages and, more particularly, to a semiconductor package including supporting stiffening and heat spreading characteristics.

2. Description of Related Art

Reference is made to FIGS. 1-3 which illustrate a sequence of process steps for producing a semiconductor package. FIG. 1 shows an organic substrate printed wire board 10. A semiconductor die 12 is attached to a top surface of the organic substrate printed wire board 10 using an under fill adhesive 14. FIG. 2 shows a stiffener ring 16 that has been attached to the top surface of the organic substrate printed wire board 10. The ring 16 surrounds the die 12 and has an outer perimeter edge coincident with an outer perimeter edge of the organic substrate printed wire board 10. An inner edge of the ring 16 is spaced away from an outer edge of the die 12. The ring 16 is attached to the organic substrate printed wire board 10 top surface using any suitable adhesive material. FIG. 3 shows a heat spreader 18 that has been attached to the top surface of the ring 16. The heat spreader 18 is illustrated to be in the form of a thermally conductive plate. The heat spreader 18 may, as shown, have an outer perimeter edge coincident with the outer perimeter edges of the ring 16 and organic substrate printed wire board 10. The spreader 18 is attached to the ring 16 top surface using any suitable adhesive material. A thermally conductive material 20 (also known in the art as a thermal interface material), which may also comprise an adhesive, is positioned between a top surface of the die 12 and a bottom surface of the heat spreader 18.

Reference is now made to FIG. 4 which illustrates package warpage for the semiconductor package shown in FIG. 3. FIG. 4 illustrates only one-quarter of the package due to symmetry. The warpage level is highest in the region 24 near the location of the die 12 and lowest in the region 26 at a corner of the package furthest away from the die 12. The dotted lines 28 indicate the gradient change in warpage moving away from the center of the package toward the perimeter of the package. FIG. 4 was obtained from finite element modeling, and shows the displacement contour of the package in FIG. 3 when cooling down to room temperature for the under fill curing process.

Reference is now made to FIG. 5 which illustrates maximum stress in the semiconductor die 12 for the semiconductor package shown in FIG. 3. FIG. 5 illustrates the stress contour on the die 12 obtained by finite element modeling. Only one-quarter of the die 12 was modeled due to symmetry. The maximum stress level is highest in the region 32 near the corner of the die 12 and decreases moving away from the region 34. The dotted lines 34 indicate the gradient change in maximum stress level.

SUMMARY OF THE INVENTION

In an embodiment, a semiconductor package comprises: a substrate board; a semiconductor die attached to a top surface of the substrate board; an integrally formed heat spreader having a plate portion and a peripheral sidewall portion, a bottom edge of the peripheral sidewall portion being attached to the top surface of the substrate board; and a stiffening ring positioned within the peripheral sidewall portion of the heat spreader and surrounding the semiconductor die, the stiffening ring being attached to the top surface of the substrate board and attached to a bottom surface of the plate portion of the heat spreader.

In an embodiment, a semiconductor package comprises: a substrate board; a semiconductor die attached to a top surface of the substrate board; a single piece stiffener and supporting member attached to the top surface of the substrate board, the single piece stiffener and supporting member including a inner ring portion and an outer ring portion, and further including a plurality of tie bars extending between and interconnecting the inner ring portion and outer ring portion; and a heat spreader plate having a bottom surface mounted to a upper surface of the single piece stiffener and supporting member.

In an embodiment, a stiffener for a semiconductor package comprises: a stiffening ring having a central opening sized and shaped to fit around a semiconductor die within the package and having an outer perimeter sized and shaped to fit within an inner peripheral edge of a heat spreader for the package.

In an embodiment, a stiffener and supporting member for a semiconductor package comprises: an inner ring portion having a central opening sized and shaped to fit around a semiconductor die within the package; an outer ring portion sized and shaped to provide a space between the inner ring portion and the outer ring portion; and a plurality of tie bars extending between and interconnecting the inner ring portion and outer ring portion.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 6:
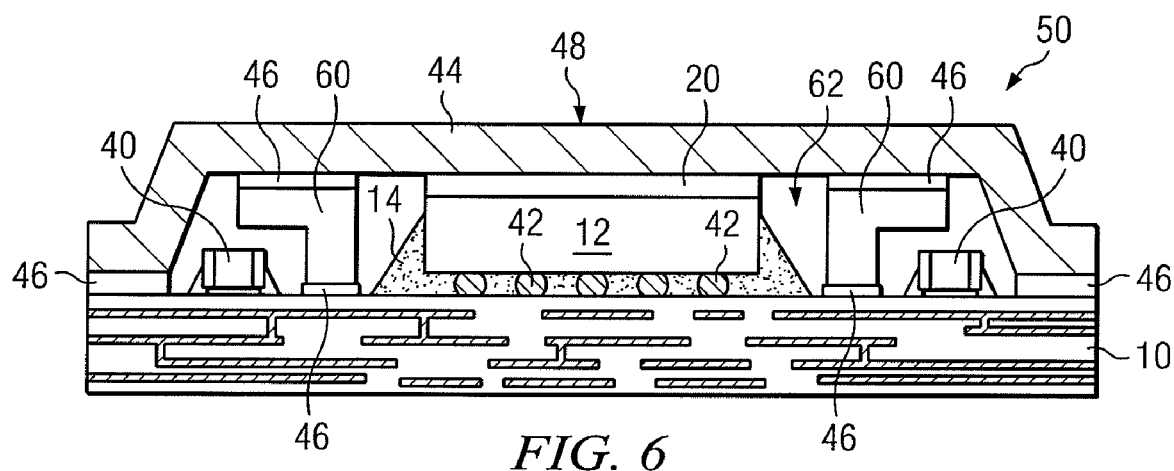
FIG. 6 shows a cross-sectional view of a semiconductor package.

Reference is now made to FIG. 6 which shows a cross-sectional view of a semiconductor package. A semiconductor die 12 is attached to a top surface of an organic substrate printed wire board 10 using an under fill adhesive 14. One or more passive components 40 (for example, surface mount components) may also be attached to the top surface of the organic substrate printed wire board 10. Electrical connection of the die 12 to the organic substrate printed wire board 10 is made through solder bumps 42. A heat spreader 44 is attached to the top surface of the organic substrate printed wire board 10 using an adhesive 46 (that may, or may not, be the same as the adhesive 14). The heat spreader 44 includes a plate portion 48 integrally formed with a peripheral side wall portion 50. A lower edge of the peripheral side wall portion 50 is mounted to the top surface of the organic substrate printed wire board 10 with the adhesive 46. A thermally conductive material 20 (also known in the art as a thermal interface material), which may also comprise an adhesive, is positioned between a top surface of the die 12 and a bottom surface of the plate portion 50 for the heat spreader 44. It will be noted that the package configuration of FIG. 6 replaces the separately provided stiffener ring 16 of FIG. 3 at the perimeter of the package with the integrally formed side wall portion 50.

The package of FIG. 6 further includes a stiffening ring 60. This stiffening ring 60 differs from the ring 16 of FIG. 3 in terms of both shape and position. The ring 60 is positioned close to the die 12 between an outer peripheral edge of the die and an inner edge of the side wall portion 50 of the heat spreader 44. The ring 60 is thus provided to support the bottom surface of the plate portion 48 of the heat spreader 44. A bottom edge of the ring is mounted to the top surface of the organic substrate printed wire board 10 with the adhesive 46. A top edge of the ring is mounted to the bottom surface of the plate portion 48 of the heat spreader 44 with the adhesive 46.

Figure 1:
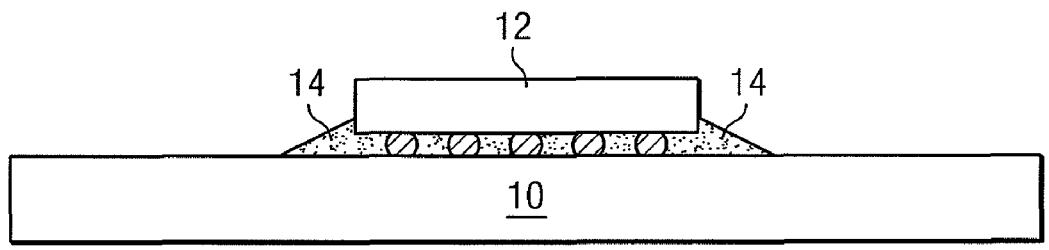
FIG. 1 illustrates a step in the process of producing a semiconductor package.
Figure 2:
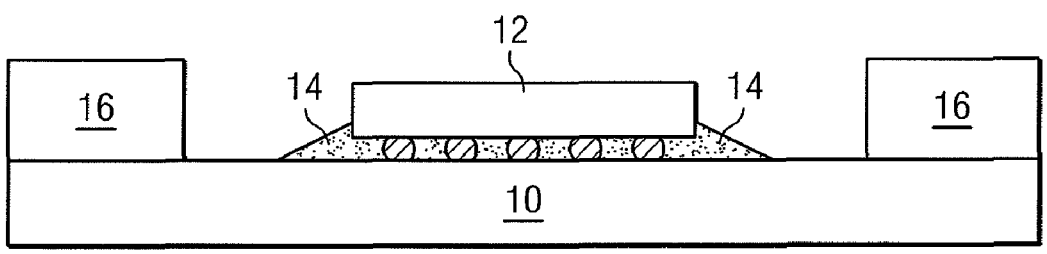
FIG. 2 illustrates a step in the process of producing a semiconductor package.
Figure 3:
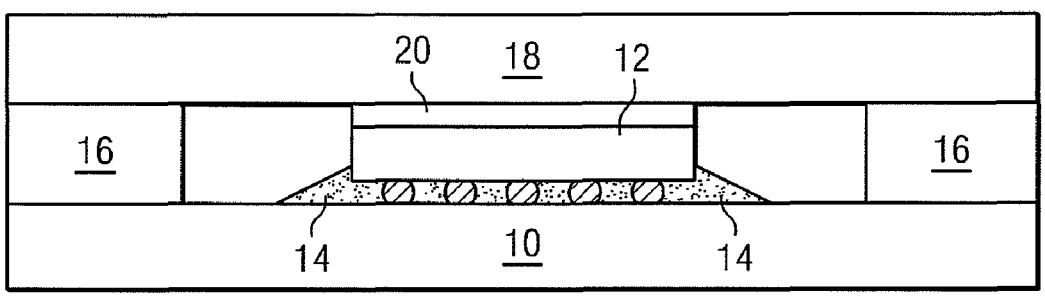
FIG. 3 illustrates a step in the process of producing a semiconductor package.

The stiffening ring 60 can, in an implementation, have a cross-sectional I-shape. This implementation is not explicitly shown in FIG. 6, but the ring 60 in this implementation would have a cross-sectional shape similar to the ring 16 as shown in FIG. 3. The placement of the ring 60, however, as discussed above, would differ from the placement of the ring 16. A central opening 62 in the ring 60 is sized and shaped to comfortably fit the die 12 and adhesive 14. The outer perimeter of the ring 60 is sized and shaped to comfortably fit within the inner edge of the side wall portion 50 of the heat spreader 44.

Figure 9:
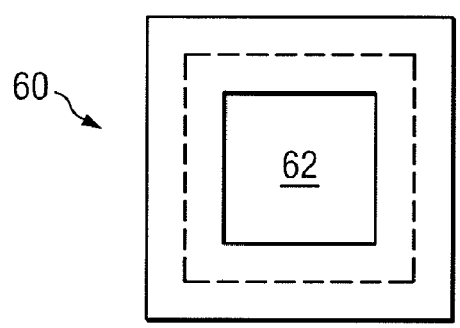
FIG. 9 shows a plan view of an inner stiffener ring for use in the package of FIG. 6.
Figure 10:
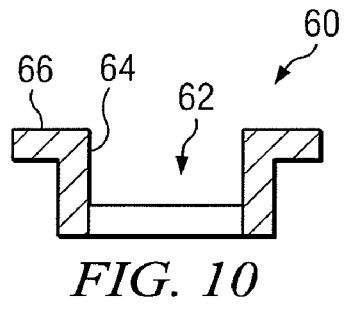
FIG. 10 shows a cross-sectional view of the inner stiffener ring shown in FIG. 9.

The stiffening ring 60 can, in an implementation, have a cross-sectional L-shape. This implementation is explicitly shown in FIGS. 6 and 10. The L-shape includes a vertical leg 64 and a horizontal leg 66. FIG. 9 shows a plan view of the stiffening ring 60 having a cross-sectional L-shape as shown in FIGS. 6 and 10. A central opening 62 in the ring 60 is sized and shaped to comfortably fit the die 12 and adhesive 14. The outer perimeter of the ring 60 is sized and shaped to comfortably fit within the inner edge of the side wall portion 50 of the heat spreader 44. When installed, the cross-sectional L-shape of the stiffening ring 60 will be oriented upside-down. This installation orientation is advantageous in that the horizontal leg 66 provides support to the bottom surface of the plate portion 48 of the heat spreader 44 while the vertical leg 64 provides space allowing for the efficient installation of the passive components 40 (for example, surface mount components) to the top surface of the organic substrate printed wire board 10 underneath the horizontal leg 66.

Figure 7:
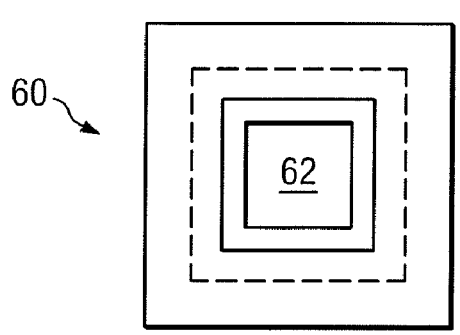
FIG. 7 shows a plan view of an inner stiffener ring for use in the package of FIG. 6.
Figure 8:
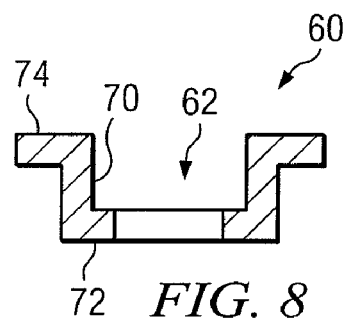
FIG. 8 shows a cross-sectional view of the inner stiffener ring shown in FIG. 7.

The stiffening ring 60 can, in an implementation, have a cross-sectional Z-shape. This implementation is explicitly shown in FIG. 8. The Z-shape includes a vertical leg 70, a lower horizontal leg 72 and an upper horizontal leg 74. FIG. 7 shows a plan view of the stiffening ring 60 having a cross-sectional Z-shape as shown in FIG. 8. A central opening 62 in the ring 60 is sized and shaped to comfortably fit the die 12 and adhesive 14. The outer perimeter of the ring 60 is sized and shaped to comfortably fit within the inner edge of the side wall portion 50 of the heat spreader 44. The cross-sectional Z-shape is advantageous in that the upper horizontal leg 74 provides support to the bottom surface of the plate portion 48 of the heat spreader 44 while the vertical leg 70 and lower horizontal leg 72 provide space allowing for the efficient installation of the passive components 40 (for example, surface mount components) to the top surface of the organic substrate printed wire board 10 underneath the upper horizontal leg 74.

The stiffening ring 60 is preferably positioned as close to the die 12 as possible. In a preferred implementation, the stiffening ring 60 is positioned between the die 12 and any included passive components 40. The stiffening ring 60 may further function as a dam for stopping the spreading of the under fill adhesive 14.

Figure 4:
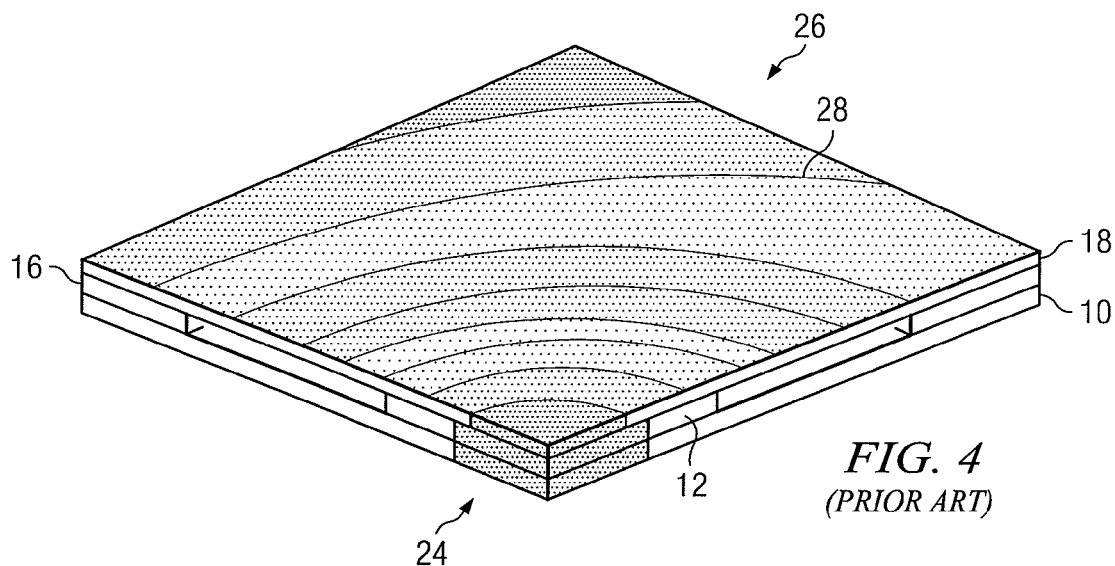
FIG. 4 illustrates package warpage for the semiconductor package shown in FIG. 3.
Figure 11:
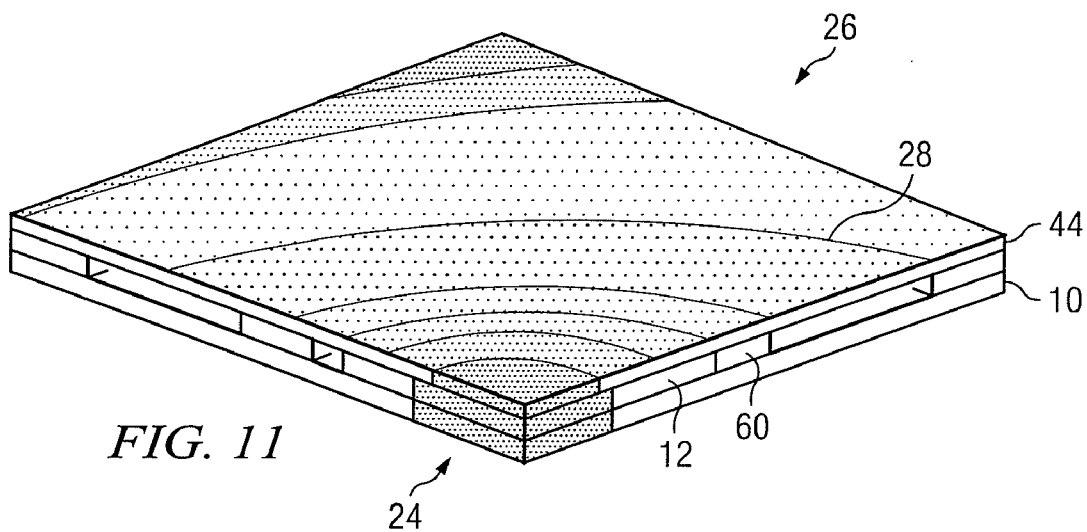
FIG. 11 illustrates package warpage for the semiconductor package shown in FIG. 6.

Reference is now made to FIG. 11 which illustrates package warpage for the semiconductor package shown in FIG. 6. Again, finite element modeling techniques were used to obtain FIG. 11. FIG. 11 illustrates only one-quarter of the package due to symmetry of the package. The warpage level is highest in the region 24 near the location of the die 12 and lowest in the region 26 at a corner of the package furthest away from the die 12. The dotted lines 28 indicate the gradient change in warpage moving away from the center of the package toward the perimeter of the package. In comparison to FIG. 4, the package warpage in FIG. 11 is 50% less than that experienced with the package of FIG. 3.

Figure 5:
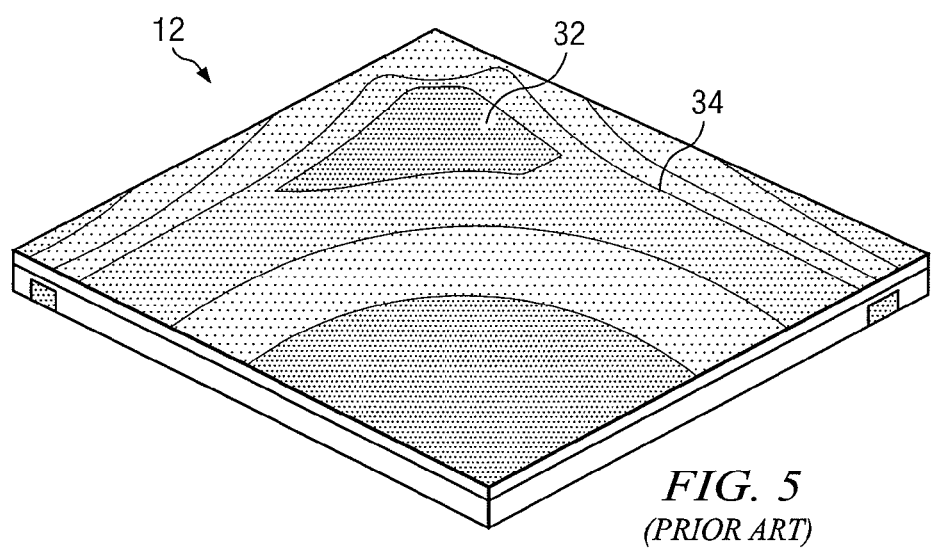
FIG. 5 illustrates maximum stress in the semiconductor die for the semiconductor package shown in FIG. 3.
Figure 12:
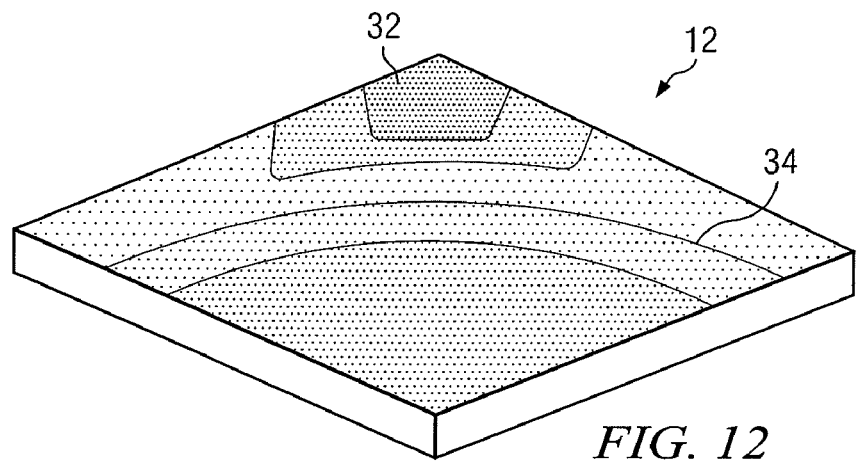
FIG. 12 illustrates maximum stress in the semiconductor die for the semiconductor package shown in FIG. 6.

Reference is now made to FIG. 12 which illustrates maximum stress in the semiconductor die 12 for the semiconductor package shown in FIG. 3. FIG. 12 illustrates only one-quarter of the die 12. The maximum stress level is highest in the region 32 near the corner of the die 12 and decreases moving away from the region 34. The dotted lines 34 indicate the gradient change in maximum stress level. In comparison to FIG. 5, the maximum stress in FIG. 15 is 14% less than that experienced with the package of FIG. 3.

Benefits of the FIG. 6 implementation which comprises a) a single piece heat spreader; and b) an inner stiffening ring are: improved package rigidity; improved warpage and stress performance during temperature cycling; and maximizing surface area available for surface mount components on the organic substrate.

Figure 13:
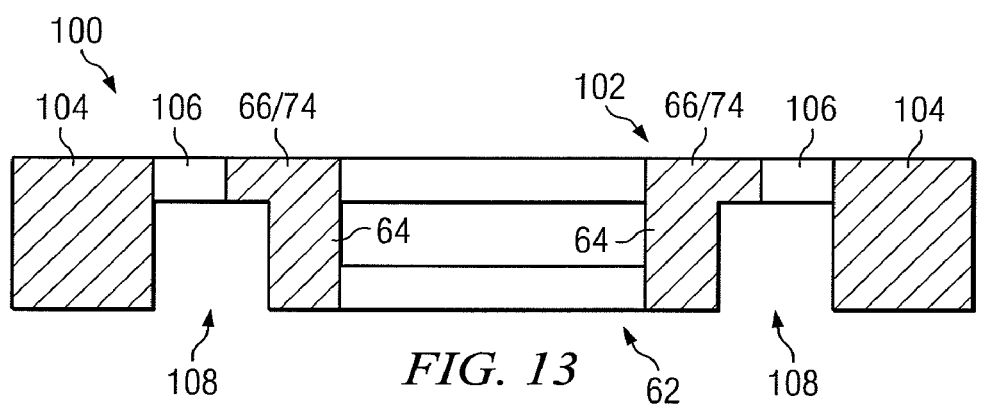
FIG. 13 is a cross-sectional illustration of a single piece stiffener and supporting member.
Figure 14:
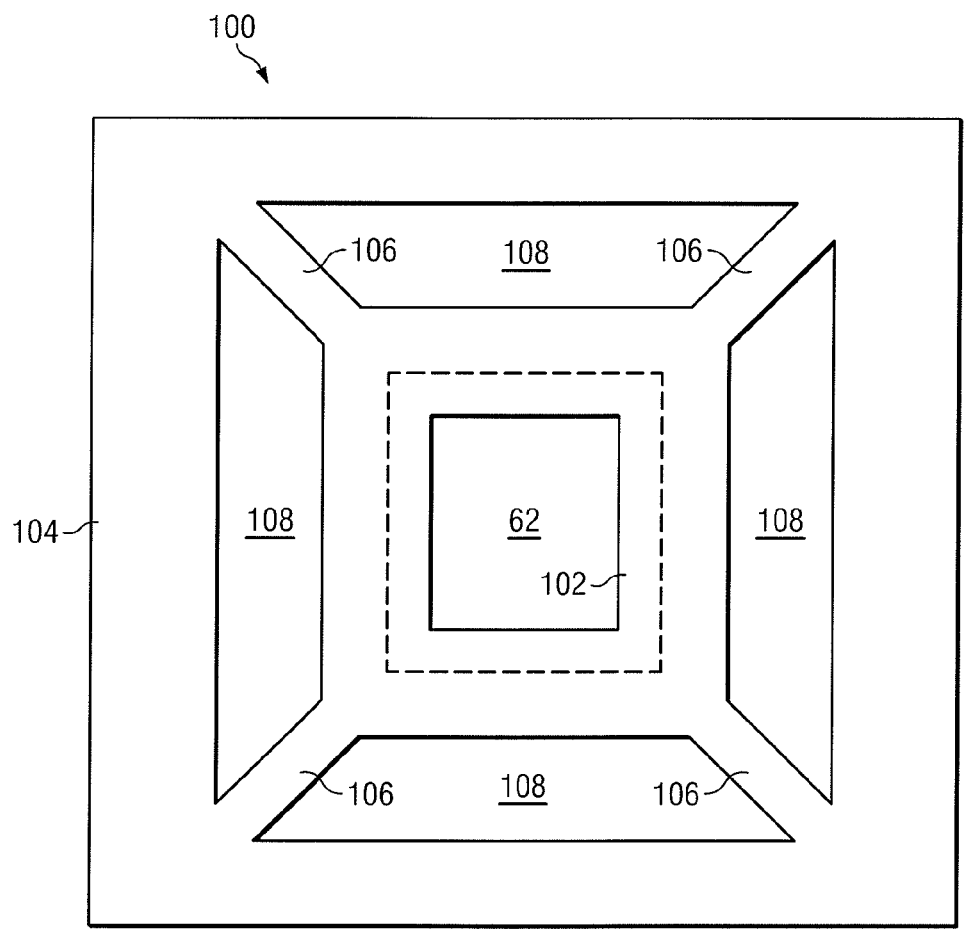
FIG. 14 is a plan view of the single piece stiffener and supporting member shown in FIGS. 13.

Reference is now made to FIG. 13 which is a cross-sectional illustration of a single piece stiffener and supporting member 100. A plan view of the member 100 is shown in FIG. 14. The member 100 is formed to include an inner ring structure 102 and an outer ring structure 104. The inner ring structure 102 has the form of the stiffening ring 60 of FIGS. 6-10 (in any of the I-, L- or Z-shapes). A central opening 62 is provided in the inner ring structure 102. The outer ring structure 104 has the form of the ring 16 of FIG. 3 (for example, in the I-shape). Space 108 in the form of an annulus is provided between the inner ring structure 102 and the outer ring structure 104. The outer ring structure 104 is tied to the inner ring structure 102 by a set of tie bars 106. In a preferred implementation, the tie bars 106 are positioned at the corners of the member 100 extending from the upper horizontal leg 66 or 74 of the inner ring structure 102.

Figure 15:
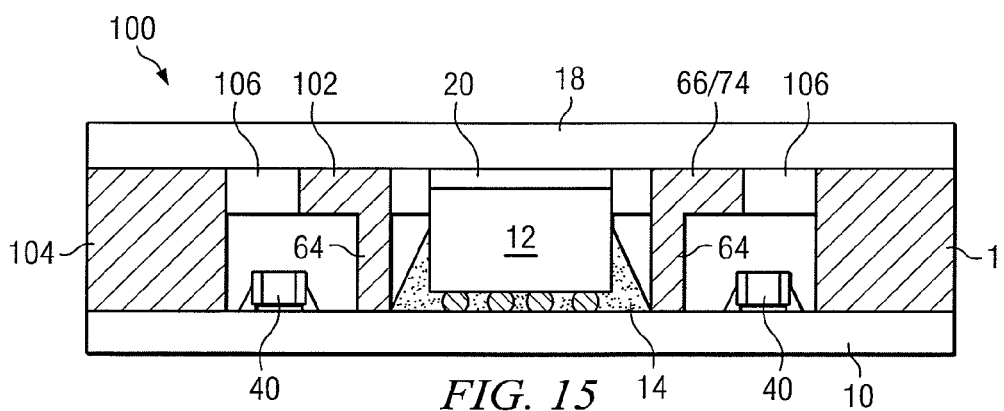
FIG. 15 illustrates installation of the single piece stiffener and supporting member in a semiconductor package.

Reference is now made to FIG. 15 which illustrates installation of the single piece stiffener and supporting member in a semiconductor package. A semiconductor die 12 is attached to a top surface of the organic substrate printed wire board 10 using an under fill adhesive 14. The single piece stiffener and supporting member 100 is attached to the top surface of the organic substrate printed wire board 10 using any suitable adhesive material. The inner ring structure 102 surrounds the die 12. An inner edge of the inner ring structure 102 is spaced away from an outer edge of the die 12. The central opening 62 provided in the inner ring structure 102 is sized and shaped to comfortably fit the die 12 and adhesive 14. The inner ring structure 102 may further function as a dam for stopping the spreading of the under fill adhesive 14.

The outer ring structure 104 may, as shown, have an outer perimeter edge coincident with an outer perimeter edge of organic substrate printed wire board 10. Space 108 is provided between the inner ring structure 102 and the outer ring structure 104. One or more passive components 40 (for example, surface mount components) may be attached to the top surface of the organic substrate printed wire board 10 in the space 108. The inner ring structure 102, outer ring structure 104 and tie bars 106 are integrally formed of a same material to form the single integral piece.

A heat spreader 18 is attached to the top surface of the single piece stiffener and supporting member 100. The heat spreader 18 is illustrated to be in the form of a thermally conductive plate. The heat spreader 18 may, as shown, have an outer perimeter edge coincident with the outer perimeter edges of the single piece stiffener and supporting member 100 and organic substrate printed wire board 10. The spreader 18 is attached to the single piece stiffener and supporting member 100 top surface using any suitable adhesive material. A thermally conductive material 20 (also known in the art as a thermal interface material), which may also comprise an adhesive, is positioned between a top surface of the die 12 and a bottom surface of the heat spreader 18.

The upper horizontal leg 66 or 74 provides support to the bottom surface of the heat spreader 18 while the vertical leg 64 or 70 provides room allowing for the efficient installation of the passive components 40 (for example, surface mount components) to the top surface of the organic substrate printed wire board 10 underneath the upper horizontal leg 66 or 74 in the space 108. The tie bars 106 extend from the upper horizontal leg 66 or 74 to the outer ring structure 104 in a manner which allows for the installation of the passive components 40 to the top surface of the organic substrate printed wire board 10 underneath the tie bars 106.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A semiconductor package, comprising:
   a substrate board;
   a semiconductor die attached to a top surface of the substrate board;
   an integrally formed heat spreader having a plate portion and a peripheral sidewall portion, a bottom edge of the peripheral sidewall portion being attached to the top surface of the substrate board;
   a stiffening ring positioned within the peripheral sidewall portion of the heat spreader and surrounding the semiconductor die, the stiffening ring being attached to the top surface of the substrate board and attached to a bottom surface of the plate portion of the heat spreader; and
   wherein the substrate board includes a surface region between the stiffening ring and the peripheral sidewall portion of the heat spreader.

2. The package of claim 1 wherein the substrate board is an organic substrate printed wire board.

3. The package of claim 1 further including a thermal interface material positioned between a top surface of the semiconductor die and the bottom surface of the plate portion of the heat spreader.

4. The package of claim 1 wherein the stiffening ring has an L-shaped cross-section, a horizontal leg of the L-shaped cross-section stiffening ring being attached to the bottom surface of the plate portion of the heat spreader.

5. The package of claim 1 wherein the stiffening ring has a Z-shaped cross-section, a horizontal leg of the Z-shaped cross-section stiffening ring being attached to the bottom surface of the plate portion of the heat spreader.

6. The package of claim 1 wherein the surface region between the stiffening ring and the peripheral sidewall portion of the heat spreader is sized sufficient to support the mounting of passive electrical components to the top surface of the substrate board.

7. A stiffener for a semiconductor package, comprising:
   a stiffening ring having a central opening sized and shaped to fit around a semiconductor die within the package and having an outer perimeter sized and shaped to fit within an inner peripheral edge of a heat spreader for the package; and
   wherein the outer perimeter is sized and shaped to provide a space between the inner peripheral edge of the heat spreader for the package and the outer perimeter of the stiffening ring.

8. The stiffener of claim 7 wherein the space stiffening ring is sized sufficient to permit installation of passive electrical components between the inner peripheral edge of the heat spreader for the package and the outer perimeter of the stiffening ring.

9. The stiffener of claim 8 wherein the stiffening ring has an L-shaped cross-section.

10. The stiffener of claim 8 wherein the stiffening ring has a Z-shaped cross-section.

11. A semiconductor package, comprising:
    a substrate board;
    a semiconductor die attached to a top surface of the substrate board;
    a single piece stiffener and supporting member attached to the top surface of the substrate board, the single piece stiffener and supporting member including an inner ring portion and an outer ring portion, and further including a plurality of tie bars extending between and interconnecting the inner ring portion and outer ring portion; and
    a heat spreader plate having a bottom surface mounted to a upper surface of the single piece stiffener and supporting member.

12. The package of claim 11 wherein the substrate board is an organic substrate printed wire board.

13. The package of claim 11 wherein the inner ring portion, outer ring portion and tie bars are integrally formed.

14. The package of claim 11 wherein the tie bars are positioned at corners of the inner ring portion and outer ring portion.

15. The package of claim 11 further including a thermal interface material positioned between a top surface of the semiconductor die and the bottom surface of the heat spreader plate.

16. The package of claim 11 wherein the inner ring portion has an L-shaped cross-section, a horizontal leg of the L-shaped cross-section inner ring portion being attached to the bottom surface of the heat spreader plate.

17. The package of claim 11 wherein the inner ring portion has a Z-shaped cross-section, a horizontal leg of the Z-shaped cross-section inner ring portion being attached to the bottom surface of the heat spreader plate.

18. The package of claim 11 wherein the substrate board includes a region between the inner ring portion and the outer ring portion supporting the mounting of passive electrical components to the top surface of the substrate board.

19. A stiffener and supporting member for a semiconductor package, comprising:
- an inner ring portion having a central opening sized and shaped to fit around a semiconductor die within the package;
- an outer ring portion sized and shaped to provide a space between the inner ring portion and the outer ring portion; and
- a plurality of tie bars extending between and interconnecting the inner ring portion and outer ring portion.

20. The stiffener and supporting member of claim 19 wherein the tie bars are positioned at corners of the inner ring portion and outer ring portion.

21. The stiffener and supporting member of claim 19 wherein the space between the inner ring portion and the outer ring portion is sized to permit installation of passive electrical components within the package.

22. The stiffener and supporting member of claim 19 wherein the inner ring portion has an I-shaped cross-section.

23. The stiffener and supporting member of claim 19 wherein the inner ring portion has an L-shaped cross-section.

24. The stiffener and supporting member of claim 19 wherein the inner ring portion has a Z-shaped cross-section.

25. The stiffener and supporting member of claim 19 wherein the inner ring portion, outer ring portion and tie bars are integrally formed.

26. A semiconductor package, comprising:
- a substrate board;
- a semiconductor die attached to a top surface of the substrate board;
- an integrally formed heat spreader having a plate portion and a peripheral sidewall portion, a bottom edge of the peripheral sidewall portion being attached to the top surface of the substrate board; and
- a stiffening ring positioned within the peripheral sidewall portion of the heat spreader and surrounding the semiconductor die, the stiffening ring being a structural member attached to the top surface of the substrate board and attached to a bottom surface of the plate portion of the heat spreader.

* * * * *